United States Patent
Yun et al.

(10) Patent No.: US 7,573,383 B2
(45) Date of Patent: Aug. 11, 2009

(54) ELECTRONIC DEVICE AND CONTROL METHOD THEREOF

(75) Inventors: Young-hwa Yun, Seoul (KR); Sung-youn Pak, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 493 days.

(21) Appl. No.: 11/541,554

(22) Filed: Oct. 3, 2006

(65) Prior Publication Data

US 2007/0080818 A1   Apr. 12, 2007

(30) Foreign Application Priority Data

Oct. 8, 2005   (KR) .................. 10-2005-0094672

(51) Int. Cl.
*G08B 21/00* (2006.01)
(52) U.S. Cl. .......... 340/540; 340/539.23; 340/584; 340/686.1; 340/686.6; 340/687; 340/815.4; 340/815.45; 348/843
(58) Field of Classification Search ........ 340/540, 340/539.1, 539.23, 581, 584, 686.1, 686.6, 340/687, 815.4, 815.45; 361/600; 348/843
See application file for complete search history.

(56) References Cited

U.S. PATENT DOCUMENTS 5,592,234 A * 1/1997 Gardner et al. ............ 348/553
6,856,254 B1 * 2/2005 Tanaka et al. .............. 340/687
7,046,310 B2 * 5/2006 Lee .......................... 348/836
2006/0240704 A1 * 10/2006 Corbett et al. ............. 439/502

FOREIGN PATENT DOCUMENTS

| JP | 10-018813 A | 1/1998 |
|---|---|---|
| KR | 1998-0051872 A | 9/1998 |
| KR | 10-2000-0013059 A | 3/2000 |
| KR | 10-2001-0054612 A | 7/2001 |

* cited by examiner

*Primary Examiner*—Hung T. Nguyen
(74) *Attorney, Agent, or Firm*—Sughrue Mion, PLLC

(57) ABSTRACT

Disclosed is an electronic device including a plurality of connection terminals and a control method thereof. The electronic device including a plurality of connection terminals, including: a light-emitting unit disposed adjacent to the plurality of connection terminals; a sensing unit sensing whether an external connection terminal is within a predetermined sensing range with respect to the connection terminal; and a control unit controlling the light-emitting unit to emit light when it is determined that the predetermined external connection terminal is within the predetermined sensing range according to the sensed result of the sensing unit. With this configuration, the connection convenience is provided by guiding an external connection terminal to the corresponding connection terminal of the electronic device under a low luminance condition, and a control method thereof.

18 Claims, 6 Drawing Sheets

ELECTRONIC DEVICE AND CONTROL METHOD THEREOF

CROSS-REFERENCE TO RELATED APPLICATIONS

This application claims priority from Korean Patent Application No. 2005-0094672, filed on Oct. 8, 2005, in the Korean Intellectual Property Office, the disclosure of which is incorporated herein by reference.

BACKGROUND OF INVENTION

1. Field of Invention

The present invention relates to an electronic device and a control method thereof and, more particularly, to an electronic device for providing connection convenience by guiding an external connection terminal to a corresponding connection terminal of the electronic device, and a control method thereof.

2. Description of the Related Art

In general, electronic devices include a connection terminal which can be connected to an external connection terminal of an external device in order to communicate with the external device, a controller for communicating with the external device connected through the connection terminal, and a plurality of processors for performing operations under control of the controller. Recently, in order to allow communication with the multitude of various kinds of external devices, electronic devices include a plurality of connection terminals which can be connected with the external connection terminals of the various external devices. In electronic devices having the plurality of connection terminals, the connection terminals are generally disposed in the back sides of the electronic devices in consideration of the appearance of the electronic devices.

However, in order to connect a specific external device to such a conventional electronic device, a user must visually find a connection terminal corresponding to the external connection terminal of the specific external device to be connected among the plurality of connection terminals disposed on the back side of the electronic device. In this situation, a user may have difficulty in finding the corresponding connection terminal of the electronic device because the back side of the electronic device is generally under a low luminance condition.

SUMMARY OF THE INVENTION

Accordingly, it is an aspect of the present invention to provide an electronic device for providing connection convenience by guiding an external connection terminal to a corresponding connection terminal of the electronic device under a low luminance condition, and a control method thereof.

The foregoing and/or other aspects of the present invention can be achieved by providing an electronic device including a plurality of connection terminals, comprising: a light-emitting unit disposed adjacent to the plurality of connection terminals; a sensing unit which senses whether an external connection terminal is within a predetermined sensing range with respect to at least one of the connection terminals; and a control unit which controls the light-emitting unit to emit light when it is determined that the external connection terminal is within the predetermined sensing range according to the sensed result of the sensing unit.

According to an aspect of the invention, the sensing unit comprises at least one of a heat sensor which senses a heat change within the predetermined sensing range, and a motion sensor which senses a motion change within the predetermined sensing range.

According to an aspect of the invention, the external connection terminal comprises a transmitting sensor which wirelessly transmits inherent ID information, and wherein the sensing unit comprises a receiving sensor which wirelessly receives the inherent ID information from the transmitting sensor of the external connection terminal when the external connection terminal is within the predetermined sensing range.

According to an aspect of the invention, the light-emitting unit comprises light-emitting devices corresponding to the plurality of connection terminals, respectively.

According to an aspect of the invention, the control unit previously stores connection terminal connecting information related to each of the plurality of connection terminals matched with the inherent ID information of available external connection terminals, and controls a light-emitting device corresponding to at least one of the connection terminals matched with the external connection terminal when the external connection terminal is within the predetermined sensing range, to emit light, on the basis of the stored connection terminal connecting information and the inherent ID information sensed by the sensing unit.

According to an aspect of the invention, the control unit stores connection terminal function information in which the plurality of connection terminals are classified according to predetermined functions and which indicates at least one of the plurality of connection terminals having a corresponding function according to the inherent ID information of the external connection terminal, and controls the light-emitting device corresponding to the connection terminal having a function matched with the external connection terminal when the external connection terminal is within the predetermined sensing range, to emit light, on the basis of the previously stored connection terminal function information and the inherent ID information sensed by the sensing unit.

According to an aspect of the invention, the connection terminal function information comprises: at least one of connection terminal input/output information containing the inherent ID information of the external connection terminals respectively matched with input terminals and output terminals classified according to an input/output function; and connection terminal type information containing the inherent the ID information of the external connection terminals respectively matched with DVI terminals, PC terminals, component terminals, and S video terminals which are classified according to the types of external sources to be connected.

Another aspect of the present invention can be achieved by providing a method for controlling an electronic device including a plurality of connection terminals, comprising: disposing a light-emitting unit adjacent to the plurality of connection terminals; sensing whether an external connection terminal is within a predetermined sensing range with respect to at least one of the plurality of connection terminals; and controlling the light-emitting unit to emit light when it is determined that the external connection terminal is within the predetermined sensing range according to a sensed result of the sensing unit.

According to an aspect of the invention, the sensing whether the external connection terminal is within the predetermined sensing range comprises at least one of: sensing a heat change within the predetermined sensing range, and sensing a motion change within the predetermined sensing range.

According to an aspect of the invention, the sensing whether the external connection terminal is within the predetermined sensing range comprises: wirelessly transmitting inherent ID Information of a transmitting sensor wherein the transmitting sensor is provided in the external connection terminal; and wirelessly receiving the inherent ID information from the transmitting sensor of the external connection terminal which is within the predetermined sensing range.

According to an aspect of the invention, the light-emitting unit comprises light-emitting devices corresponding to the plurality of connection terminals, respectively.

According to an aspect of the invention, the method further comprises: previously storing connection terminal connecting information related to each of the plurality of connection terminals matched with the inherent ID information of available external connection terminals, wherein the controlling the light-emitting unit to emit light comprises controlling a light-emitting device corresponding to at least one of the plurality of connection terminals matched with the external connection terminal which is within the predetermined sensing range, to emit light, on the basis of the previously stored connection terminal connecting information and the received inherent ID information according to the sensed result.

According to an aspect of the invention, the method further comprises: previously storing connection terminal function information in which the plurality of connection terminals are classified according to predetermined function and which indicates at least one of the plurality of connection terminals having a corresponding function according to the inherent ID information of the available external connection terminal, wherein the controlling the light-emitting unit to emit light comprises controlling the light-emitting device corresponding to the connection terminal having a function matched with the external connection terminal which is within the predetermined sensing range, to emit light, on the basis of the previously stored connection terminal function information and the received inherent ID information according to the sensed result.

According to an aspect of the invention, the electronic device includes a connection terminal comprising: a light-emitting unit disposed in close proximity with the connection terminal, a sensing unit which senses whether an external connection terminal is within a sensing range of the connection terminal, and a control unit which controls the light-emitting unit to emit light when the external connection terminal is within the sensing range.

According to an aspect of the invention, the sensing unit comprises at least one of a heat sensor and a motion sensor.

According to an aspect of the invention, the external connection terminal comprises a transmitting sensor which transmits ID information related to the external connection terminal, and the sensing unit comprises a receiving sensor which receives the ID information when the external connection terminal is within the sensing range.

According to an aspect of the invention, the control unit stores information related to the connection terminal and controls the light-emitting device to emit light when the information related to the connection terminal is related to the ID information.

According to an aspect of the invention, the information related to the connection terminal comprises at least one of function information of the connection terminal and ID information of the external connection terminal.

BRIEF DESCRIPTION OF THE DRAWINGS

The above and/or other aspects of the prevent invention will become apparent and more readily appreciated from the following description of the exemplary embodiments, taken in conjunction with the accompany drawings, in which.

Figure 1:
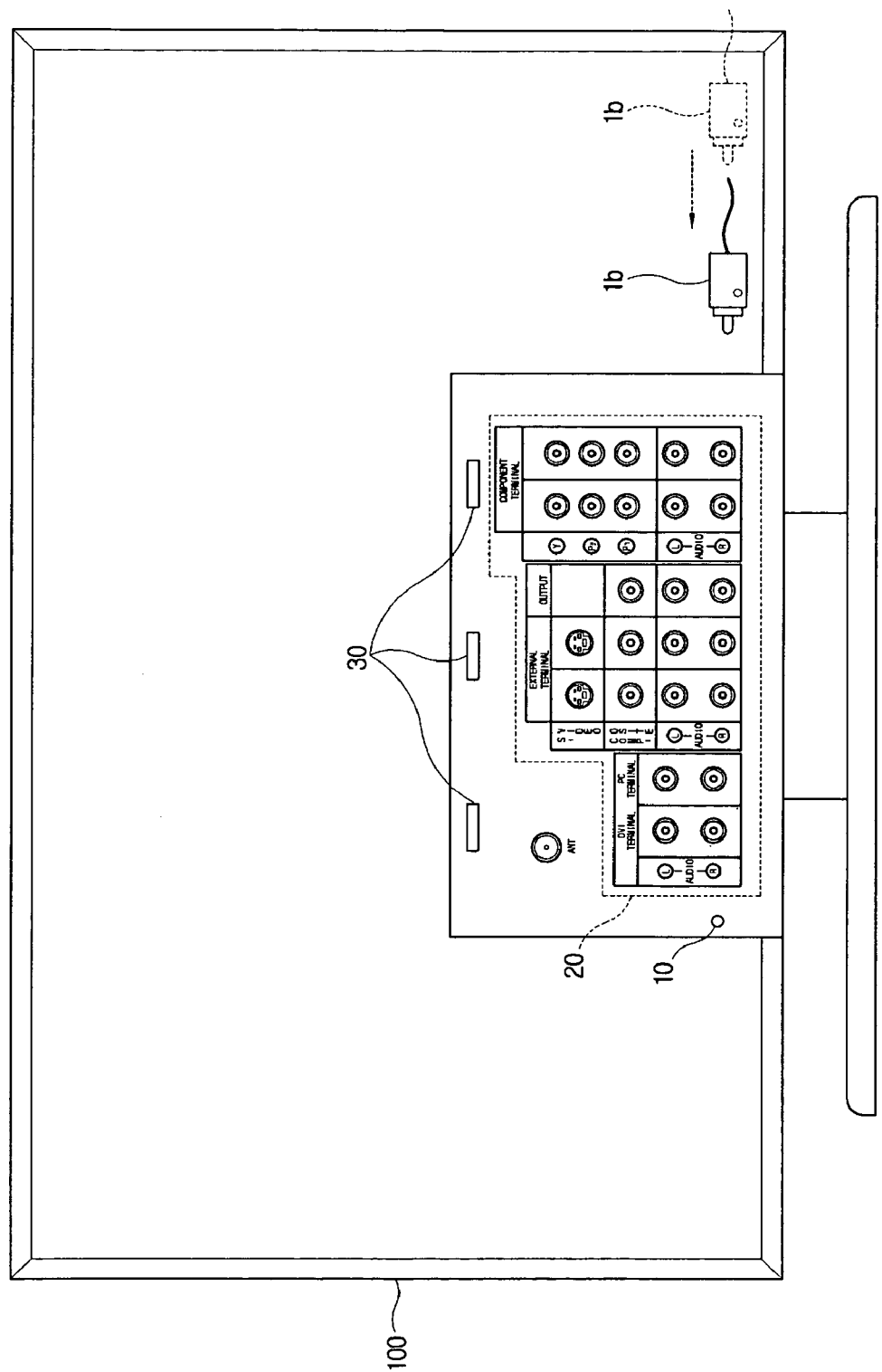
FIG. 1 is a view showing a back side of an electronic device according to a first exemplary embodiment of the present invention.

DETAILED DESCRIPTION OF THE ILLUSTRATIVE, NON-LIMITING EXEMPLARY EMBODIMENTS OF THE INVENTION

Reference will now be made in detail to the exemplary embodiments of the present invention, examples of which are illustrated in the accompanying drawings, wherein like reference numerals refer to like elements throughout. The exemplary embodiments are described below so as to explain the present invention by referring to the figures.

FIG. 1 is a view showing a back side of an electronic device 100 according to a first exemplary embodiment of the present invention. Hereinafter, it is assumed that the electronic device according to the first exemplary embodiment of the present invention is a TV 100.

Referring to FIG. 1, the back side of the TV 100 according to the first exemplary embodiment of the present invention includes a plurality of connection terminals 20, a plurality of light-emitting units 30 adjacent to the connection terminals 20, and a sensing unit 10 for sensing whether an approaching external connection terminal 1b is within a predetermined sensing range from the connection terminals 20.

When an external connection terminal 1b which has been outside the sensing range is moved within the sensing range by a user, the sensing unit 10 senses the approach of the external connection terminal 1b. Then, the respective light-emitting units 30 adjacent to the connection terminals 20 emit light in response to the sensed result of the sensing unit 10. Thus, when a user tries to find a connection terminal corresponding to an external connection terminal 1b among the plurality of connection terminals 20 disposed in the back side of the TV 100, even in a low luminance condition the user may find the connection terminal with ease.

Hereinafter, a method for controlling the TV 100 according to the first exemplary embodiment of the present invention will be described in detail with reference to FIG. 2.

Figure 2:
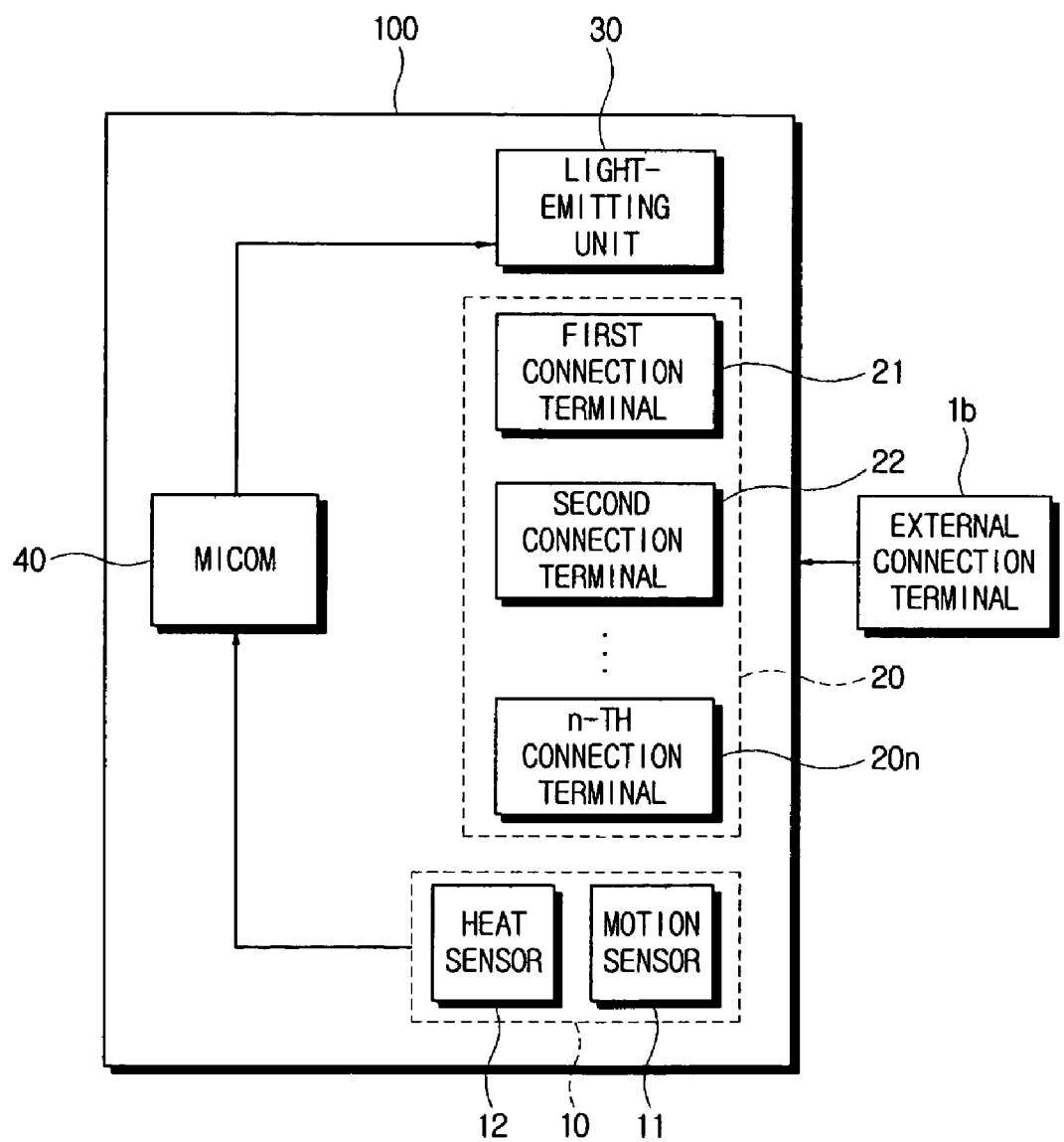
FIG. 2 is a control block diagram of the electronic device according to the first exemplary embodiment of the present invention.

Referring to FIG. 2, the TV 100 according to the first exemplary embodiment of the present invention includes a plurality of connection terminals 20 through which the TV 100 communicates with various kinds of external devices, a light-emitting unit 30 disposed adjacent to the connection terminals 20, a sensing unit 10 which senses whether an approaching external connection terminal 1b is within a predetermined sensing range from the connection terminals 20, and a microcomputer 40 which acts as a controller for controlling the light-emitting unit 30 to emit light when it is determined that an external connection terminal 1b is within the sensing range according to the sensed result of the sensing unit 10.

The connection terminals 20 include a first connection terminal 21, a second connection terminal 22, . . . , a n-th connection terminal 20n, which may have various shapes and through which the TV 100 is connected with various kinds of external devices.

The sensing unit 10 senses whether an approaching external connection terminal 1b is within a predetermined sensing range. The sensing unit 10 includes a heat sensor 12 for sensing a heat change within the sensing range and can sense the approach of the external connection terminal 1b by sensing a heat generated from a user's hand which approaches the external connection terminal 1b to the connection terminals 20. Alternatively, the sensing unit 10 includes a motion sensor 11 for sensing a motion change within the sensing range and can sense the approach of the connection terminal 1b by sensing the motion of a user' hand which approaches the external connection terminal 1b to the connection terminals 20.

The light-emitting unit 30 includes a light-emitting device for emitting light. The light-emitting device may include various devices such as a light-emitting diode for emitting light visually recognizable by a user. The light-emitting unit 30 may be disposed adjacent to the connection terminals 20, as illustrated in FIG. 1, in order to guide the external connection terminal 1b to the corresponding connection terminal when the light-emitting unit 30 emits light. However, the light-emitting unit 30 may be positioned in any other location that may promote the illumination of the corresponding connection terminal. Here, the light-emitting unit 30 may include a single light-emitting device, a predetermined number of light-emitting devices, or a plurality of light-emitting devices respectively corresponding to the plurality of connection terminals 21, 22, . . . , 20n.

When it is determined that the external connection terminal 1b is within the predetermined sensing range according to the sensed result of the sensing unit 10, the microcomputer 40 controls the light-emitting unit 30 to emit light.

In the TV 100 according to the first exemplary embodiment of the present invention, when the approaching external connection terminal 1b is within the sensing range from the connection terminals 20 provided in the back side of the TV 100, the light-emitting unit 30 disposed adjacent to the connection terminals 20 emits light. Thus, when a user tries to find the connection terminal corresponding to the external connection terminal 1b among the plurality of connection terminals 20 disposed in the back side of the TV 100, difficulty due to a low luminance condition of the back side of the TV 100 may be minimized.

Figure 3:
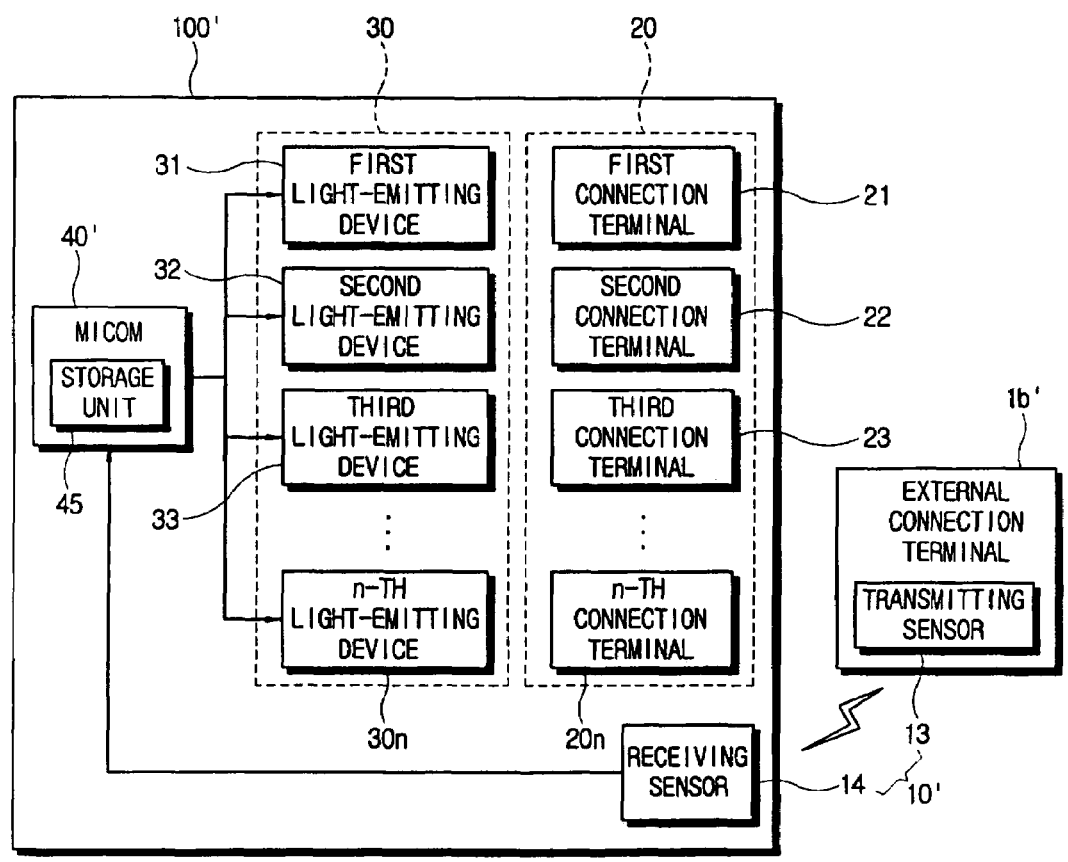
FIG. 3 is a control block diagram of an electronic device according to a second exemplary embodiment of the present invention.

Hereafter, a method for controlling a TV 100' according to a second exemplary embodiment of the present invention will be described with reference to FIG. 3. FIG. 3 is a block diagram of a control unit of the TV 100' according to the second exemplary embodiment of the present invention.

Referring to FIG. 3, the TV 100' according to the second exemplary embodiment of the present invention includes a plurality of connection terminals 20 through which the TV 100' communicates with various kinds of external devices, a light-emitting unit 30 disposed adjacent to the connection terminals 20, a sensing unit 10' which senses whether an approaching external connection terminal 1b' is within a predetermined sensing range from the connection terminals 20, and a microcomputer 40' which acts as a controller for controlling a light-emitting device of the light-emitting unit 30 corresponding to the external connection terminal 1b' to emit light when it is determined that the external connection terminal 1b' is within the sensing range according to the sensed result of the sensing unit 10'.

Like the first exemplary embodiment, the connection terminals 20 include a first connection terminal 21, a second connection terminal 22, . . . , a n-th connection terminal 20n, which may have various shapes and through which the TV 100' communicates with various kinds of external devices.

The sensing unit 10' senses whether an external connection terminal 1b' is within a predetermined sensing range from the plurality of connection terminals 20. The sensing unit 10' may include a transmitting sensor 13 provided in the external connection terminal 1b' and wirelessly transmitting inherent identification (ID) information of the external connection terminal 1b', and a receiving sensor 14 disposed adjacent to the connection terminals 20 in the back side of the TV 100', which wirelessly receives the inherent ID information from the transmitting sensor 13 of the external connection terminal 1b' when within the sensing range.

Here, the inherent ID information may indicate the kind of an external device to be connected to the TV 100' through the external connection terminal 1b'.

When the inherent ID information is transmitted or received as a wireless infrared signal between the transmitting sensor 13 and the receiving sensor 14, the sensing unit 10' can employ a light-emitting diode as the transmitting sensor 13 for transmitting the inherent ID information in the format of an infrared signal, and a light-receiving diode as the receiving sensor 14 for wirelessly receiving the inherent ID information having the format of the infrared signal from the transmitting sensor 13 of the external connection terminal 1b'. Alternatively, if the inherent ID information is transmitted or received as a radio frequency (RF) signal between the transmitting sensor 13 and the receiving sensor 14, the sensing unit 10' may employ an RF-ID tag as the transmitting sensor 13 for transmitting the inherent ID information in the format of an RF signal, and an RF reader as the receiving sensor 14 for wirelessly receiving the inherent ID information having the format of the RF signal from the transmitting sensor 13 of the external connection terminal 1b'.

Here, the RF reader acting as the receiving sensor 14 may have a predetermined distance limiting specification on reading the inherent ID information from the RF-ID tag acting as the transmitting sensor 13. The distance limiting specification may be set to correspond to the predetermined sensing range.

The light-emitting unit 30 includes a light-emitting device for emitting light. The light-emitting device may include various light-emitting devices such as a light-emitting diode for emitting light visually recognizable by a user. The light-emitting unit 30 may include a first light-emitting device 31, a second light-emitting device 32, a third light-emitting device 33, . . . , a n-th light emitting device 30n respectively corresponding to the plurality of connection terminals 21, 22, 23, . . . , 20n in order to guide the external connection terminal 1b' to its corresponding connection terminal.

The microcomputer 40' according to the second exemplary embodiment of the present invention may store connection terminal connecting information related to each connection terminals marched with inherent ID information of available external connection terminals in a storage unit 45. The microcomputer 40' receives the inherent ID information of the external connection terminal 1b' that is within the sensing range, according to the sensed result of the sensing unit 10'. Then, the microcomputer 40' controls a light-emitting device, which corresponding to a connection terminal matched with the external connection terminal 1b', to emit light, on the basis of the received inherent ID information and the previously stored connection terminal connecting information.

Figure 4A:
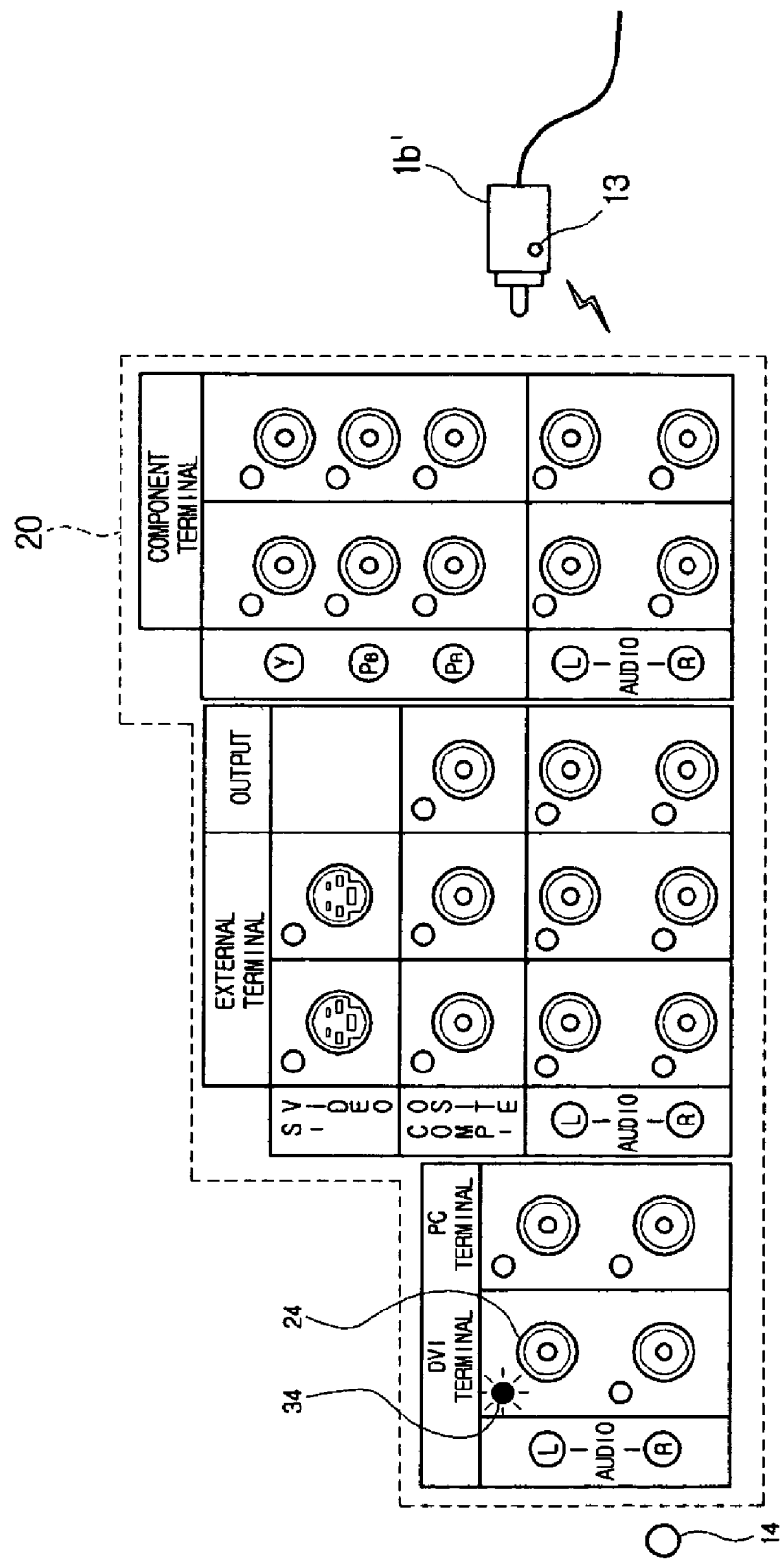
FIG. 4A is a view illustrating a state where a predetermined light-emitting device emits light when an external connection terminal approaches the electronic device according to the second exemplary embodiment of the present invention.

Hereinafter, a state where the light-emitting device corresponding to the connection terminal matched with the inherent ID information of the external connection terminal 1b' which is within the sensing range emits light, will be described with reference to FIG. 4A. Referring to FIG. 4A, the microcomputer 40' according to the second exemplary embodiment of the present invention receives the inherent ID information from the transmitting sensor 13 of the external connection terminal 1b' which is within the sensing range, according to the sensed result of the receiving sensor 14 disposed adjacent to the connection terminals 20. Then, the microcomputer 40' recognizes a DVI terminal 24 corresponding to the external connection terminal 1b' which is within the sensing range, on the basis of the received inherent ID information and the stored connection terminal connecting information, and controls a light-emitting device 34 corresponding to the DVI terminal 24 to emit light.

Thus, a user can easily find a connection terminal (for example, the DVI terminal 24) to which the external connection terminal 1b' has to be connected.

As such, in the TV 100' according to the second exemplary embodiment of the prevent invention, when an approaching external connection terminal 1b' is within the sensing range from the connection terminals 20 provided in the back side of the TV 100', a light-emitting device corresponding to a connection terminal to which the external connection terminal 1b' is to be connected, emits light. That is, the TV 100' according to the second exemplary embodiment of the present invention allows a user to quickly and easily recognize which one of the connection terminals corresponds to the external connection terminal 1b' to be connected thereto among the plurality of connection terminals 20 disposed in the back side of a TV 100.

According to a third exemplary embodiment of the present invention, the microcomputer 40' can store connection terminal function information in the storage unit 45. According to the connection terminal function information, the plurality of connection terminals 20 is classified according to predetermined functions and the connection terminals are matched with functions respectively corresponding to the inherent ID information of the available external connection terminals 1b'. Here, the connection terminal function information can include at least one of connection terminal input/output information that classifies the plurality of connection terminals 20 into input terminals for performing an input function and output terminals for performing an output function, and contains the inherent ID information of the available external connection terminals respectively matched with the classified input terminals and output terminals; and connection terminal type information that classifies the plurality of connection terminals 20 into DVI terminals, PC terminals, component terminals, and S-video terminals according to the types of external devices to be connected thereto, and contains the inherent ID information of the available external connection terminals respectively matched with the classified DVI terminals, PC terminals, component terminals, and S-video terminals.

Meanwhile, the inherent ID information provided from the transmitting sensor 13 of the external connection terminal 1b' can further include at least one of input/output information indicating whether an external device to be connected to the TV 100' through the external connection terminal 1b' is an input device or an output device, and type information regarding whether the external device to be connected to the TV 100' through the connection terminal 1b' provides a DVI signal, a PC signal, a component signal, or an S-video signal.

Thus, the microcomputer 40' according to the third exemplary embodiment receives the inherent ID information from the approaching external connection terminal 1b' which is within the sensing range according to the sensed result of the sensing unit 10', and compares the input/output information or the type informant included in the received inherent ID information with the stored connection terminal function information, thereby recognizing connection terminals having a function corresponding to the received inherent ID information. Then, the microcomputer 40' controls light-emitting devices, which correspond to the connection terminals having the function matched with the external connection terminal 1b', to emit light.

Figure 4B:
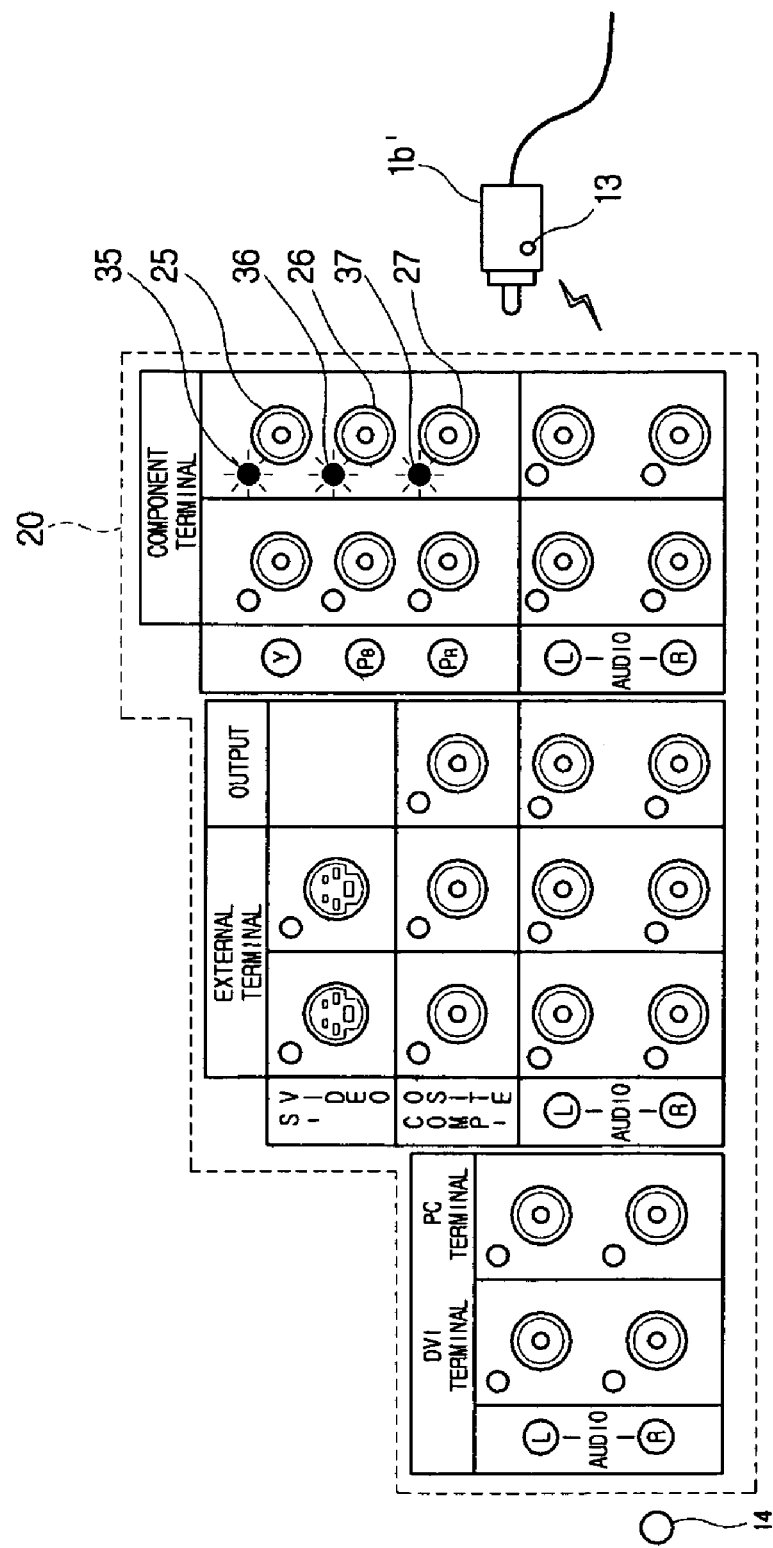
FIG. 4B is a view illustrating a state where predetermined light-emitting devices emit light when an external connection terminal approaches an electronic device according to a third exemplary embodiment of the present invention.

Hereinafter, the state where the light-emitting devices corresponding to the connection terminals having the function matched with the inherent ID information of the external connection terminal 1b', which is within the sensing range emit light, will be described with reference to FIG. 4B. Referring to FIG. 4B, the microcomputer 40' according to the third exemplary embodiment of the present invention receives the inherent ID information from the transmitting sensor 13 of the approaching external connection terminal 1b' which is within the sensing range, through the receiving sensor 14 disposed adjacent to the plurality of connection terminals 20. Then, the microcomputer 40' recognizes connection terminals (for example, component terminals 25, 26, and 27) corresponding to a function (for example, a component signal) matched with the external connection terminal 1b' which is within the sensing range, on the basis of the stored connection terminal function information and at least one (for example, type information) of input/output information and type information included in the received inherent ID information. Then, the microcomputer 40' controls one of the light-emitting devices 35, 36, and 37 corresponding to one of the component terminals 25, 26, and 27 to emit light.

That is, the microcomputer 40' informs a user of which connection terminals are matched with the external connection terminal 1b' considering the functions of the external device corresponding to the external connection terminal 1b', thereby allowing the user to more conveniently select the connection terminal to which the external connection terminal 1b' should be connected.

As such, according to the third exemplary embodiment of the present invention, when an approaching external connection terminal 1b' is within the sensing range from the plurality of connection terminals 20 provided in the back side of the TV 100', at least one of the light-emitting devices corresponding to the connection terminals to which the external connection terminal 1b' can be connected to emit light based on the functions of the external device corresponding to the external connection terminal 1b'. That is, the TV 100' according to the third exemplary embodiment of the present invention informs a user of which connection terminals correspond to the functions of the external device connected to an approaching external connection terminal 1b', among the plurality of connection terminals 20 disposed in the back side of the TV 100', thereby allowing the user to more conveniently select the connection terminal to which the external connection terminal 1*b*' should be connected.

In FIGS. 4A and 4B, the light-emitting devices respectively disposed adjacent to the respective connection terminals 20 are light-emitting diodes, however, the invention is not limited to this. That is, the light-emitting devices may include various light-emitting devices capable of independently emitting light in correspondence to the respective connection terminals 20. For example, external casing members of the respective connection terminals 20 can be made of a light-emitting material.

Figure 5:
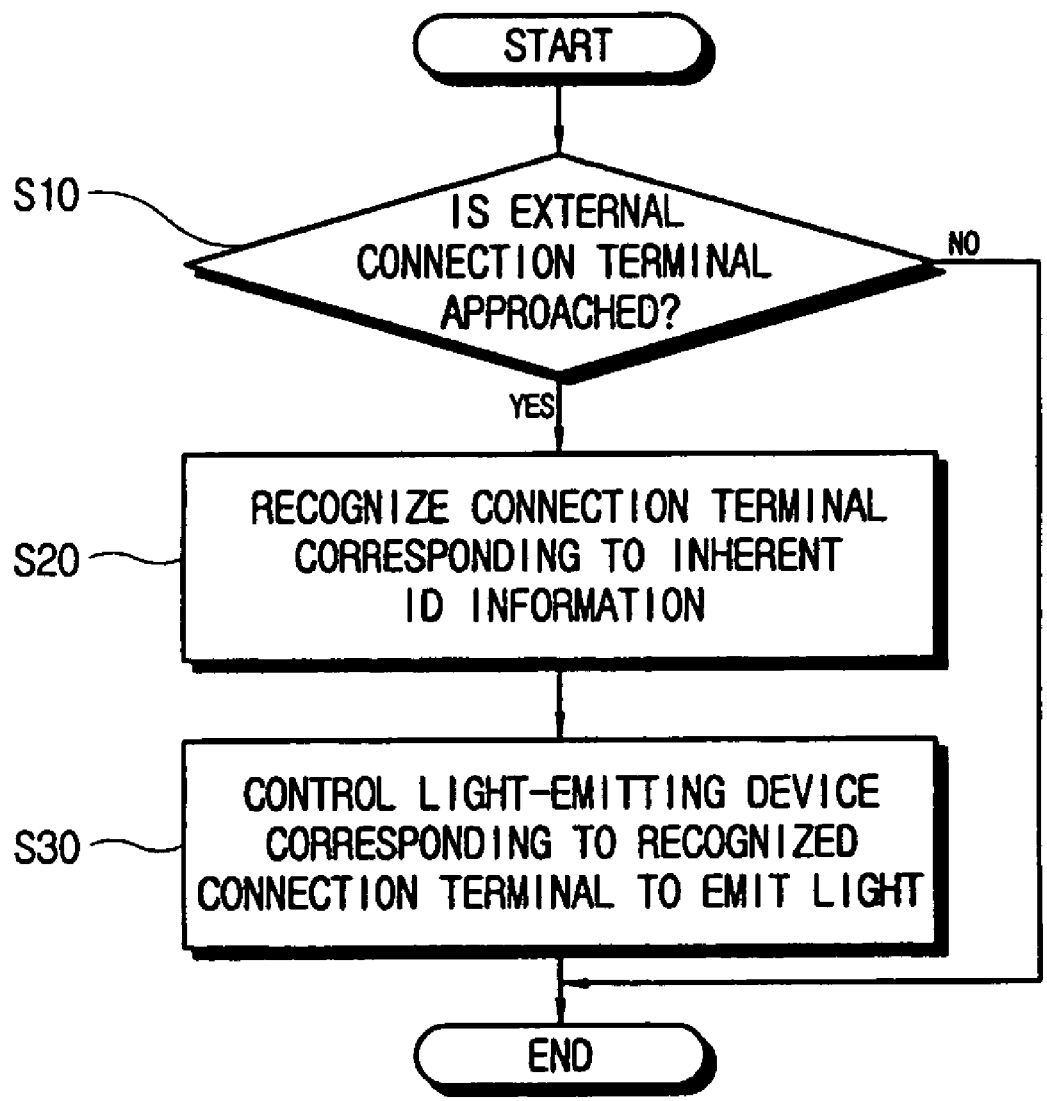
FIG. 5 is a flowchart illustrating a method for controlling the electronic device according to the second exemplary embodiment of the present invention.

Hereinafter, a flowchart illustrating a method for controlling the TV 100' according to the second exemplary embodiment of the present invention will be described with reference to FIGS. 3 and 5.

First, the microcomputer 40' determines whether the external connection terminal 1*b*' is within a predetermined sensing range on the basis of the sensed result of the sensing unit 10', at operation S10. When an external connection terminal 1*b*' is within the sensing range, the microcomputer 40' compares the inherent ID information transmitted from the external connection terminal 1*b*' with the previously stored connection terminal connecting information, and recognizes the connection terminal corresponding to the inherent ID information of the external connection terminal 1*b*' at operation S20. Then, the microcomputer 40' controls a light-emitting device (for example, a light-emitting device 34 of FIG. 4A) corresponding to the recognized connection terminal (for example, a DVI terminal 24 of FIG. 4A) to emit light at operation S30.

Through the above-described configuration, in an electronic device and a control method thereof, according to the exemplary embodiments of the present invention, by controlling a predetermined light-emitting device to emit light when an approaching external connection terminal is within a predetermined sensing range from a plurality of connection terminals disposed in the back side of the electronic device, a user can conveniently and visually check the plurality of connection terminals in the back side of the electronic device which may be under a low luminance condition. Also, an electronic device and a control method thereof according to the exemplary embodiments of the present invention allow a user to quickly and easily recognize a connection terminal corresponding to an external connection terminal to be connected among the plurality of connection terminals disposed in the back side of the electronic device.

As described above, according to the exemplary embodiments of the present invention, there is provided an electronic device for providing connection convenience by guiding an external connection terminal to a corresponding connection terminal of the electronic device under a low luminance condition, and a control method thereof.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. An electronic device including a plurality of connection terminals, comprising:
    a light-emitting unit disposed adjacent to the plurality of connection terminals;
    a sensing unit which senses whether an external connection terminal is within a predetermined sensing range with respect to at least one of the connection terminals; and
    a control unit which controls the light-emitting unit to emit light when it is determined that the external connection terminal is within the predetermined sensing range according to a sensed result of the sensing unit.

2. The electronic device according to claim 1, wherein the sensing unit comprises at least one of a heat sensor which senses a heat change within the predetermined sensing range, and a motion sensor which senses a motion change within the predetermined sensing range.

3. The electronic device according to claim 1, wherein the external connection terminal comprises a transmitting sensor which wirelessly transmits inherent ID information,
    wherein the sensing unit comprises a receiving sensor which wirelessly receives the inherent ID information from the transmitting sensor of the external connection terminal when the external connection terminal is within the predetermined sensing range.

4. The electronic device according to claim 3, wherein the light-emitting unit comprises light-emitting devices corresponding to the plurality of connection terminals, respectively.

5. The electronic device according to claim 4, wherein the control unit previously stores connection terminal connecting information related to each of the plurality of connection terminals matched with the inherent ID information of available external connection terminals, and controls a light-emitting device corresponding to at least one of the connection terminals matched with the external connection terminal when the external connection terminal is within the predetermined sensing range, to emit light, on the basis of the stored connection terminal connecting information and the inherent ID information sensed by the sensing unit.

6. The electronic device according to claim 4, wherein the control unit stores connection terminal function information in which the plurality of connection terminals are classified according to predetermined functions and which indicates at least one of the plurality of connection terminals having a corresponding function according to the inherent ID information of the external connection terminal, and controls the light-emitting device corresponding to the connection terminal having a function matched with the external connection terminal when the external connection terminal is within the predetermined sensing range, to emit light, on the basis of the previously stored connection terminal function information and the inherent ID information sensed by the sensing unit.

7. The electronic device according to claim 6, wherein the connection terminal function information comprises: at least one of connection terminal input/output information containing the inherent ID information of the external connection terminals respectively matched with input terminals and output terminals classified according to an input/output function; and connection terminal type information containing the inherent ID information of the external connection terminals respectively matched with DVI terminals, PC terminals, component terminals, and S video terminals which are classified according to the types of external sources to be connected.

8. A method for controlling an electronic device including a plurality of connection terminals, comprising:
    disposing a light-emitting unit adjacent to the plurality of connection terminals;
    sensing whether an external connection terminal is within a predetermined sensing range with respect to at least one of the plurality of connection terminals; and
    controlling the light-emitting unit to emit light when it is determined that the external connection terminal is within the predetermined sensing range according to a sensed result of the sensing unit.

9. The method according to claim 8, wherein the sensing whether the external connection terminal is within the predetermined sensing range comprises at least one of:
sensing a heat change within the predetermined sensing range, and
sensing a motion change within the predetermined sensing range.

10. The method according to claim 8, wherein the sensing whether the external connection terminal is within the predetermined sensing range comprises:
wirelessly transmitting inherent ID Information of a transmitting sensor wherein the transmitting sensor is provided in the external connection terminal; and
wirelessly receiving the inherent ID information from the transmitting sensor of the external connection terminal which is within the predetermined sensing range.

11. The method according to claim 10, wherein the light-emitting unit comprises light-emitting devices corresponding to the plurality of connection terminals, respectively.

12. The method according to claim 11, further comprising: previously storing connection terminal connecting information related to each of the plurality of connection terminals matched with the inherent ID information of available external connection terminals,
wherein the controlling the light-emitting unit to emit light comprises controlling a light-emitting device corresponding to at least one of the plurality of connection terminals matched with the external connection terminal which is within the predetermined sensing range, to emit light, on the basis of the previously stored connection terminal connecting information and the received inherent ID information according to the sensed result.

13. The method according to claim 11, further comprising: previously storing connection terminal function information in which the plurality of connection terminals are classified according to predetermined functions and which indicates at least one of the plurality of connection terminals having a corresponding function according to the inherent ID information of the available external connection terminal,
wherein the controlling the light-emitting unit to emit light comprises controlling the light-emitting device corresponding to the connection terminal having a function matched with the external connection terminal which is within the predetermined sensing range, to emit light, on the basis of the previously stored connection terminal function information and the received inherent ID information according to the sensed result.

14. An electronic device including a connection terminal comprising:
a light-emitting unit disposed in close proximity with the connection terminal;
a sensing unit which senses whether an external connection terminal is within a sensing range of the connection terminal; and
a control unit which controls the light-emitting unit to emit light when the external connection terminal is within the sensing range.

15. The electronic device according to claim 14, wherein the sensing unit comprises at least one of a heat sensor and a motion sensor.

16. The electronic device according to claim 14, wherein the external connection terminal comprises a transmitting sensor which transmits ID information related to the external connection terminal,
wherein the sensing unit comprises a receiving sensor which receives the ID information when the external connection terminal is within the sensing range.

17. The electronic device according to claim 16, wherein the control unit stores information related to the connection terminal and controls the light-emitting device to emit light when the information related to the connection terminal is related to the ID information.

18. The electronic device according to claim 17, wherein the information related to the connection terminal comprises at least one of function information of the connection terminal and ID information of the external connection terminal.

* * * * *